United States Patent [19]

Taylor et al.

[11] Patent Number: 4,997,678

[45] Date of Patent: Mar. 5, 1991

[54] CHEMICAL VAPOR DEPOSITION PROCESS TO REPLICATE THE FINISH AND FIGURE OF PRESHAPED STRUCTURES

[75] Inventors: Raymond L. Taylor, Saugus; Michael A. Pickering, Dracut; Joseph T. Keeley, Woburn, all of Mass.

[73] Assignee: CVD Incorporated, Woburn, Mass.

[21] Appl. No.: 425,076

[22] Filed: Oct. 23, 1989

[51] Int. Cl.$^5$ .................. C23C 16/00; G02B 5/08
[52] U.S. Cl. .................. 427/249; 427/255.1; 427/255.2; 427/255.7; 427/248.1; 427/255; 427/314; 427/299; 249/115
[58] Field of Search .............. 427/249, 248.1, 255.7, 427/255.1, 255.2, 255, 299, 314, 162; 249/115; 428/912.2

[56] References Cited

U.S. PATENT DOCUMENTS

| | | | |
|---|---|---|---|
| 3,905,778 | 9/1975 | Pearson | 29/191 |
| 4,142,006 | 2/1979 | Choyke et al. | 427/162 |
| 4,426,405 | 1/1984 | Hieholzer, Jr. | 427/50 |
| 4,513,030 | 4/1985 | Milewski | 427/227 |
| 4,753,414 | 6/1988 | McCandless | 249/115 |
| 4,814,332 | 3/1989 | Bluege et al. | 428/450 |

Primary Examiner—Norman Morgenstern
Assistant Examiner—Roy V. King
Attorney, Agent, or Firm—Gerald K. White

[57] ABSTRACT

A process is disclosed by which the finish and figure of polished preshaped structures (such as mirrors) can be replicated directly by chemical vapor deposition, with only minor polishing of the replica being required to obtain a final product, and with the original substrate being reusable for further replication. Relevant conditions under which the process can be carried out are given. Featured in the process is a pretreatment step prior to the deposition of a layer of silicon carbide to form the replica, which pretreatment step involves the formation on the polished substrate of an oxide layer and a carbon layer of high finish and uniform thickness. The carbon layer allows easy separation of the substrate and replica which otherwise would be bound together.

21 Claims, 2 Drawing Sheets

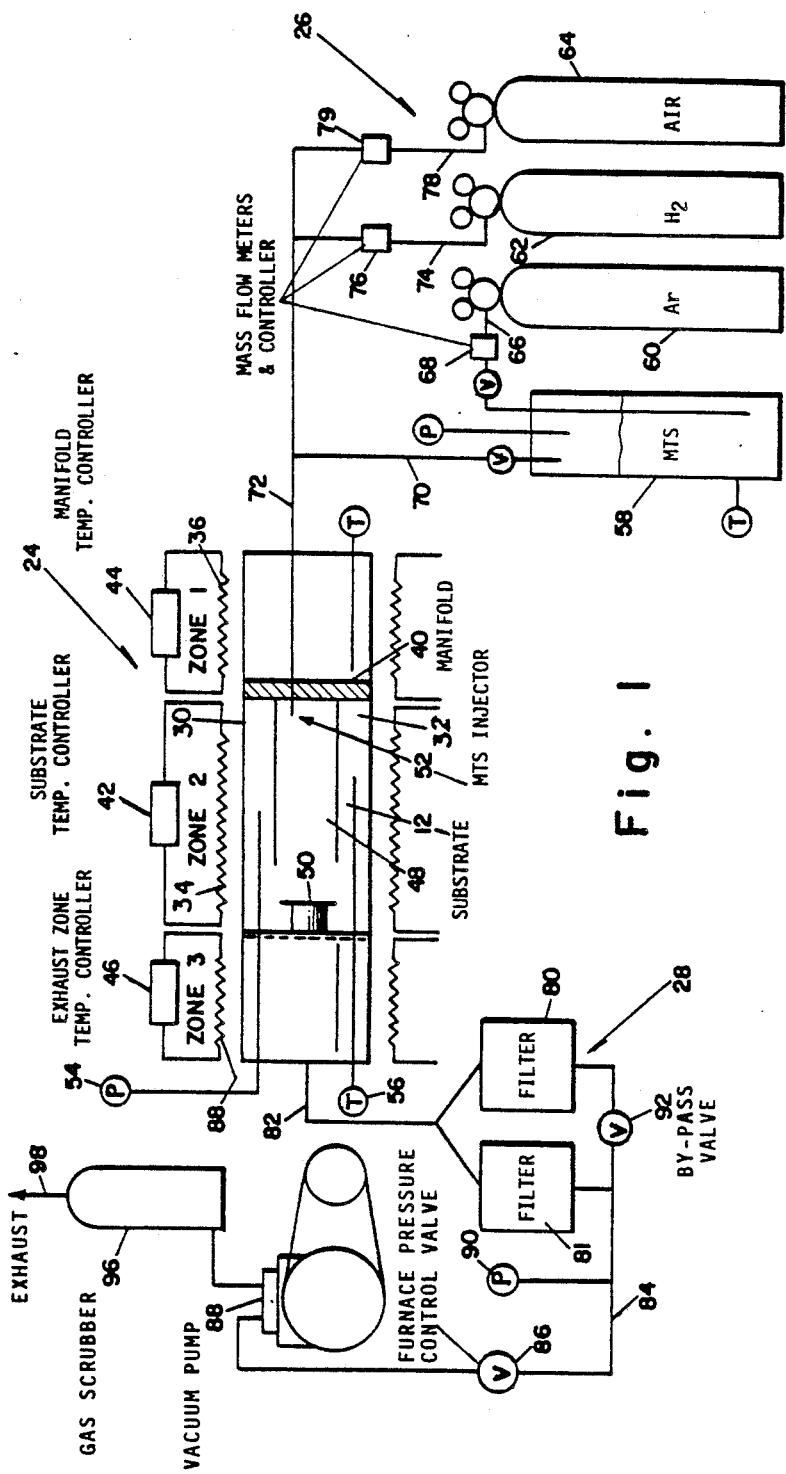

CHEMICAL VAPOR DEPOSITION PROCESS TO REPLICATE THE FINISH AND FIGURE OF PRESHAPED STRUCTURES

This invention was made with Government support under contract F33615-87-C-5227 awarded by the Air Force. The Government has rights in this invention.

BACKGROUND OF THE INVENTION

1. Field of the Invention

This invention relates to a process using chemical vapor deposition for replicating, that is, making close copies of the finish and figure of preshaped structures. The invention has particular utility in the rapid fabrication of highly polished optics with only minor polishing being required on the replica to obtain a final product, and with the original substrate or mandrel being reusable. The invention also has utility in the rapid fabrication of such products as ceramic engine components and ceramic tubes.

2. Description of the Prior Art

In the field of optics, light detection and ranging (LIDAR) has come to be recognized as an important diagnostic tool for remote measurement of a diversity of atmospheric parameters such as minor species concentrations, pressure, temperature, and water vapor profiles, aerosol cloud distributions, and wind fields. LIDAR techniques such as measurement of back scattered signals, differential absorption, and Doppler shifts have been used to obtain information about the earth's atmosphere.

The performance of a LIDAR system depends upon the optical configuration of its receiving telescope. Often, due to space limitations such as in a shuttle borne LIDAR system, the length of the telescope is fixed. Therefore, the optical designer must select a particular shape and optics speed of the mirrors to maximize the throughput of the telescope. The most critical element in the receiving telescope is the primary mirror because of its size, weight, fabrication cost, and thermal exposure to the outside world. Since the received signal is directly proportional to the area of the primary mirror, it is important to use as large a primary mirror as feasible to obtain reasonable signal levels for accurate measurement. This is particularly true when a space-borne LIDAR system is used to measure wind profiles in the troposphere on a global basis.

The conventional techniques employed in the prior art for fabricating large ($\geq 1.0$ meter diameter) mirrors are quite slow and time consuming. Several months to years are required to fabricate a large mirror from ultra low expansion silica glass or Zerodur, a product commercially available from Schott Glass Technologies, Inc., 400 York Avenue, Duryea, PA 18462. Since a number of space-based LIDAR systems are planned for the future, considerable attention is currently being given to the development of techniques for the rapid and economic production of large, high performance mirrors.

A spin casting technique has been proposed to fabricate 1.2 meter and 3.5 meter diameter glass mirror blanks containing lightweight honeycomb cells. Although this technique is relatively faster than the conventional mirror fabrication methods and produces lightweight mirrors, the weight of these mirrors is still an order of magnitude more than permissible for many space applications. Further, the spin-casting technique is unsuitable for fabricating large mirrors of advanced ceramics such as silicon carbide (SiC), titanium diboride ($TiB_2$), and boron carbide ($B_4C$) that have high melting points. These latter materials have properties superior to those of glass for large lightweight optics.

Other techniques involving the casting of fiber reinforced composites containing epoxy and plastics and the stretching of membranes over appropriate substrates are also currently under investigation.

A process is disclosed in application for patent bearing Serial No. 389,248, filed Aug. 3, 1989 by J. T. Goela, M. A. Pickering and R. L. Taylor and assigned to the assignee of the present invention, for fabricating, by vapor deposition, lightweight structures out of refractory materials. The methods and lightweight structures disclosed in that application, which application by reference is incorporated herein, involve a core made of graphite to define the shape and size of each structure. The core is coated with an appropriate deposit, such as SiC or silicon (Si), to give the structure strength and stiffness and for bonding thereof to another surface, for example, the surface of a substrate comprising the faceplate of a mirror being fabricated.

In the fabrication of mirrors, it has been proposed, as disclosed in the above mentioned application for patent, to use graphite to form a substrate or mandrel for replicating on a SiC faceplate. One side of the mandrel is optically fabricated, either as flat or as a convex spherical shape. The other side of the mandrel is lapped flat. The lapped side of the mandrel is bonded by means of pillars and graphite cement to a baffle plate in a vapor deposition reactor. The mandrel is then coated with multiple coats of a suspension of carbon in solvent, following which the surface of the mandrel is buffed or polished to make it as shiny as possible without significantly altering its figure. Deposition of silicon carbide on the mandrel is then effected. Without separating the faceplate from the mandrel, the exposed silicon carbide surface may be etched with hot potassium hydroxide (KOH) to improve bonding of graphite to silicon carbide. A lightweight structure core of graphite is then fabricated and bonded with graphite cement to the silicon carbide surface of the mandrel. Silicon carbide is then chemically vapor deposited to enclose the core following which the baffle plate is separated from the baffle pillars. Controlled edging may be performed to remove excess silicon carbide. Using a blade, the interface between the graphite mandrel and the silicon carbide faceplate may then be opened to recover the silicon carbide mirror faceplate.

While this process disclosed in the aforementioned application for patent has advanced the development of lightweight rapid optics fabrication technology, the final product produced by the process is a mirror blank that is not of the desired high optical quality, that is, high finish, required for space-based LIDAR systems. A reason for this is that graphite which is used for the mandrel does not take a high polish. Additionally, there is a substantial difference in the coefficients of thermal expansion (CTE) between graphite and silicon carbide. Graphite deforms substantially more than silicon carbide at the high temperatures (about 1300° C.) at which deposition of silicon carbide in a chemical vapor deposition reactor takes place. As a result, replication of the ambient or room temperature figure of a graphite substrate or mandrel by chemical vapor deposition of silicon carbide is not achievable in practice. Compensation for the difference in coefficients of thermal expansion is exceedingly difficult to effect.

Thus, there is a need and a demand to provide a rapid fabrication process to replicate with high optical quality the finish and figure of preshaped optical and other structures. The present invention was devised to fill the technological gap that has existed in the art in these respects.

SUMMARY OF THE INVENTION

An object of the invention is to provide a chemical vapor deposition process to replicate the finish and figure of preshaped structures.

Another object of the invention is to provide a process to replicate the very high finish and figure of polished silicon carbide mirror substrates or mandrels thereby to facilitate the rapid fabrication of mirrors of high optical quality with only minor polishing of the replica being required to obtain a final product.

A further object of the invention is to provide such a process in which the original substrate or mandrel can be reused.

Still another object of the invention is to provide an economical and facile process for the rapid fabrication of preshaped structures by the use of chemical vapor deposition in which the need for compensation for differences in the coefficients of thermal expansion between the material of the original substrate or mandrel employed and the material being deposited on the mandrel to form the replica is avoided.

An additional object of the invention is to provide a chemical vapor deposition process to replicate the finish and figure of a preshaped polished silicon carbide substrate comprising the steps of:

(a) pretreating the substrate in situ by the deposition thereon of a thin carbon film of high finish and uniform thickness; and (b) forming a replica of the finish and figure of the substrate by vapor depositing a layer of silicon carbide of predetermined thickness on the carbon film.

A further object of the invention is to provide a process to replicate the finish and/or figure of preshaped structures comprising the steps of:

(a) loading a polished preshaped substrate to be replicated into a chemical vapor deposition furnace;

(b) evacuating, leak checking and then heating the chemical vapor deposition furnace;

(c) introducing gases into the furnace that are operative at the temperature therein to cause a thin carbon layer of high finish and uniform thickness to be formed on the substrate;

(d) introducing gases into the furnace to cause the deposition of a layer of SiC onto the carbon layer on the substrate, said layer of SiC comprising a replica of the substrate; and (e) cooling the furnace to ambient temperature, removing the substrate/replica, and separating the substrate and replica.

In accomplishing these and other objectives, there has been provided, in accordance with the invention, a chemical vapor deposition process to replicate the finish and figure of highly polished silicon carbide substrates or mandrels (for convenience, termed substrates hereinafter).

In the operation of a chemical vapor deposition apparatus, gases are introduced into a hot furnace or reactor where they react at the walls of the furnace or at the surface of a substrate or other structure loaded into or placed in the furnace and form a solid deposit or coating. For the deposition of SiC on the substrate, methyltrichlorosilane ($CH_3SiCl_3$, hereinafter referred to as MTS), hydrogen ($H_2$), and argon (Ar) gases are introduced into the furnace through a stainless steel injector. Since MTS is a liquid at ambient or room temperature, Ar is bubbled through the MTS liquid and carries the MTS vapor above the liquid to the injector. Gases that are unreacted in the furnace are pumped out by means of a vacuum pump, filtered, and cleaned in a gas scrubber before being vented to the atmosphere.

By the use of this process, thick deposits ($\geq 0.25$ inch; 0.63 cm.) of SiC can be made. Typical conditions for the deposition of SiC are

| Substrate temperature | | 1300° C. |
|---|---|---|
| Furnace Pressure | | 200 torr |
| Partial pressure of gases | Ar | 68 torr |
| | $H_2$ | 102 torr |
| | MTS | 30 torr |

In a first step of the replication process, according to the invention, a polished preshaped substrate is loaded into the chemical vapor deposition furnace and heated to 1300° C. In principle, the substrate can be made from any material that has a melting point that is higher than the deposition temperature of the material being deposited. The finish and/or figure replication of the substrate will be poor, however, if the material of the substrate reacts with the gases used in the replication process.

In a second step of the replication process, gases are added into the chemical vapor deposition furnace which form a thin carbon layer of film on the substrate, which carbon layer or film is characterized in having a high finish and uniform thickness. Three different gas mixtures may be used to form such a carbon layer or film for subsequent replication. These gas mixtures comprise:

(1) MTS +Ar;

(2) Oxygen ($O_2$) +Ar; and (3) $O_2$ +Ar followed by $O_2$ +MTS +Ar.

Argon is used only as a carrier gas. The $O_2$ source may be special high purity air (i.e., 20% $O_2$ and 80% nitrogen ($N_2$).

In a third step in the replication process, SiC is deposited onto the carbon film with the deposition continuing until a layer of SiC of desired thickness is obtained.

In a fourth and final step, the furnace or reactor is cooled to room temperature, the substrate/replica is removed, and the substrate/replica separated. The carbon layer allows for the easy separation of the substrate and replica which otherwise would be bound tightly together.

SiC replication may be achieved using the three different gas mixtures described above. The best replication is obtained using the two-step pretreatment process, $O_2$ +Ar followed by $O_2$ +MTS +Ar.

The general conditions under which the replication occurs using the three gas mixtures are:

| (1) MTS + AR | | |
|---|---|---|
| Substrate temperature | | 1300° C. |
| Furnace pressure | | 90.0 torr |
| Partial pressure of gases | Ar | 78.7 torr |
| | MTS | 11.3 torr |

| -continued | | |
|---|---|---|
| Deposition time | | 10 min. |
| (2) O₂ + AR | | |
| Substrate temperature | | 1300° C. |
| Furnace pressure | | 100–400 torr |
| Partial pressure of gases | Ar | 98–392 torr |
| | O₂ | 0.4–1.6 torr |
| Deposition time | | 5–15 min. |
| (3) O₂ + AR followed by O₂ + MTS + Ar | | |
| First Step | | |
| Substrate temperature | | 1300° C. |
| Furnace pressure | | 200 torr |
| Partial pressure of gases | Ar | 196 torr |
| | O₂ | 0.8 torr |
| Deposition time | | 4–5 min |
| Second Step | | |
| Substrate temperature | | 1300° C. |
| Furnace pressure | | 200 torr |
| Partial pressure of gases | Ar | 177–196 torr |
| | O₂ | 0.8 torr |
| | MTS | 3–19 torr |
| Deposition time | | 2–5 min. |

In the preferred embodiment of the invention, the total flow of the various gases through the reaction chamber of the chemical vapor deposition furnace is maintained substantially constant during the in situ pretreatment period and also the subsequent normal chemical vapor deposition silicon carbide growth period.

Chemical vapor deposition onto a substrate which is of the same material as that which is being deposited is very advantageous. This is for the reason that with such arrangement there is no coefficient of thermal expansion difference for which compensation otherwise would have to be provided to obtain a correct, that is, a matching figure, on the replicated mirror. Thus, replication of the ambient or room temperature figure of a silicon carbide substrate may be effected notwithstanding that the deposition of the chemically vapor deposited SiC occurs at an elevated temperature (1300° C.). This is because there is no coefficient of thermal compensation mismatch.

The various features of novelty which characterize the invention are pointed out with particularity in the claims annexed to and forming a part of this specification. For a better understanding of the invention, its operating advantages, and specific objects attained by its use, reference is made to the accompanying drawings and descriptive matter in which preferred embodiments of the invention are illustrated.

BRIEF DESCRIPTION OF THE DRAWINGS

With this description of the invention, a detailed description follows with reference being made to the accompanying drawings which form part of the specification, of which:

FIG. 1 is a schematic illustration of a chemical vapor deposition apparatus that may be employed for the pretreatment of a polished silicon carbide substrate and also for the subsequent deposition thereon of a SiC coating or layer in replicating the finish and figure of the substrate;

FIG. 2 schematically illustrates, in side view, a SiC substrate having a polished upper surface;

FIG. 3 schematically illustrates, in side view, the substrate of FIG. 2 after a first pretreatment of the upper surface thereof with O₂ and CH₃SiCl₃ deposition thereon of a thin carbon film;

FIG. 4 schematically illustrates, in side view, the substrate of FIG. 3 after the chemical vapor deposition on the upper surface thereof of a replicating coating or layer of SiC;

FIG. 5 schematically illustrates the separation of the substrate and the replica of FIG. 4;

FIG. 6 shows a polished chemically vapor deposited SiC substrate (left-hand side) and an as-deposited chemically vapor deposited silicon carbide mirror (right-hand side) replicated therefrom

DESCRIPTION OF THE PREFERRED EMBODIMENTS

Figure 7:
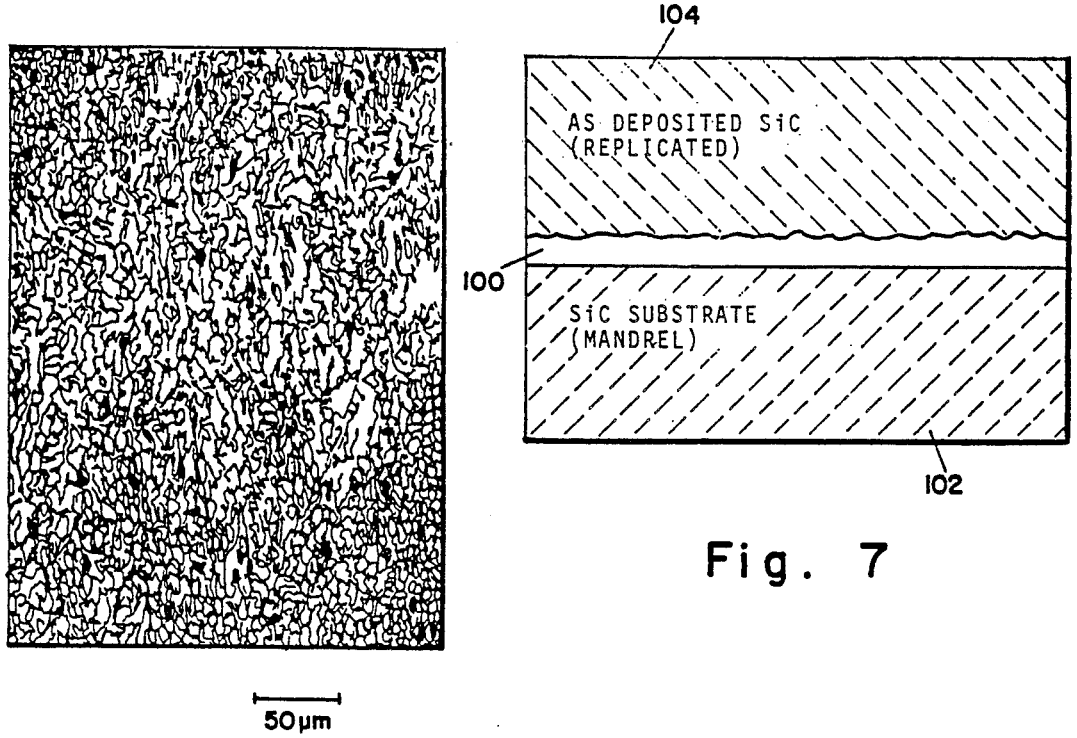
FIG. 7 is a schematic illustration that is in further explanation of the SiC replication process according to the invention.

With respect to important properties of potential large space-based optics materials, silicon carbide has been identified as the leading candidate based on the excellent mechanical, thermal and physical properties thereof, and additionally, existing evidence that large monolithic pieces of silicon carbide can be produced by means of a chemical vapor deposition process.

A scalable chemical vapor deposition process was devised using MTS as a source for silicon carbide. Chemical vapor deposited silicon carbide material was produced and characterized for important physical, mechanical, thermal and optical properties relevant to large space-based optics. The chemically vapor deposited silicon carbide is theoretically dense, single phase (cubic), high purity, fine grained polycrystalline material possessing high flexural strength (595 MPa), high thermal conductivity (198 $Wm^{-1}k^{-1}$), high elastic modulus (460 GPa), and excellent polishability (<10 ÅRMS).

The feasibility of replicating polished prefigured silicon carbide mirrors directly by the chemical vapor deposition process according to the invention was demonstrated in small scale experiments in which polished silicon carbide mirror surfaces were produced with only minor polishing of the replica being required to obtain a final product, and with the original silicon carbide substrate being reusable.

While in the preferred embodiment of the invention, the polished original substrate which is to be replicated is made of chemically vapor deposited SiC, it is to be understood that such silicon carbide substrate may be formed by other methods that are known in the art.

FIGS. 2–5 of the drawings collectively provide an illustrative explanation of the steps involved in the replication of a silicon carbide mirror. Thus, FIG. 2 shows, in side view, a substrate having an upper surface 14 that is highly polished. The shape of the surface may be flat or curved. When curved, the shape of the surface 14 is the converse, that is, a "negative" of the surface of the replica that is to be fabricated. For example, if it is desired that the surface of the replica have an inward curve, as in a concave mirror, the shape of the polished surface 14 of the substrate 12 is so shaped as to have an outward curve, as in a convex mirror.

FIG. 3 shows the substrate 12 after the deposition, in situ, on the polished surface 14 of a carbon film 16 that has been deposited on the surface 14.

FIG. 4 shows the substrate after the deposition on the carbon film 16 of a coating or layer 18 of SiC.

FIG. 5 shows the separation of the substrate 12 and the layer or replica 18.

A feature of the invention is that the separation of the substrate 12 and the replica 18 occurs without the need for the application of force to pry them apart.

By the use of the process excellent replication of chemically vapor deposited SiC onto the polished surface of a substrate is obtained. This is demonstrated by FIG. 6 which is a representation of a photograph of the surface 14 of the polished chemically vapor deposited silicon carbide substrate 12 (left-hand side of the figure) and the surface 22 of an as-deposited chemical vapor deposited silicon carbide mirror 20 (right-hand side of the figure), replicated from the substrate 12, reflecting an image (the letters "SiC") located in front of the two surfaces 14 and 22.

FIG. 1 schematically illustrates a chemical vapor deposition apparatus 10 that may be used in accordance with the invention for forming, in situ, carbon film 16 on the polished surface of the substrate that is to be replicated, such as the surface 14 of the substrate 12 of FIGS. 2–5 described above, and for effecting the deposition of a SiC layer 18 on top of the carbon film 16.

The chemical vapor deposition apparatus 10 includes a horizontal research furnace 24 which may comprise an electrically heated 3-zone Lindberg furnace 24. The apparatus 10 further includes a reactant supply system 26 and an exhaust system 28.

Associated with the furnace 24 is an elongated tube 30 of aluminum oxide ($Al_2O_3$) containing a reaction or deposition chamber 32 in which a substrate 12 to be replicated is placed. Tube 30 is substantially coextensive with zone 2 of the 3-zone furnace 24. Zone 2 is heated by an electrical heating element 34. Zones 1 and 3 comprise manifold and exhaust zones, respectively, and are heated by individually associated electrical heating elements 36 and 38. A manifold 40 is provided at the interface of zones 1 and 2.

A substrate temperature controller 42 controls the energization of the heating element 34. Similarly, a manifold temperature controller 44 controls the energization of the heating element 36 and an exhaust temperature controller 46 controls the energization of the heating element 38.

Located within the deposition chamber 32 is a deposition zone 48 in which the substrate 12 is placed. The substrate 12 in FIG. 1 is shown as consisting of four sides of an open box. Also included in the deposition chamber 32 is a baffle plate 50. An injector 52 made of stainless steel extends through the mainfold 40 into the deposition zone 48. The pressure and temperature within the zone 48 are indicated by a pressure gauge 54 and a temperature gauge 56, respectively.

The reactant supply system 26 includes a bubbler cylinder and dip tube device 58 containing MTS, a tank 60 comprising a source of argon under pressure, a tank 62 comprising a source of hydrogen under pressure, and a tank 64 containing a source of purified or "special" air (20% $O_2$ and 80% $N_2$) under pressure. Argon flows through a flow line 66 to the bubbler cylinder and dip tube device 58. A mass flowmeter and controller 68 connected in the flow line 66 controls the flow of argon.

Argon bubbles carrying the reagent MTS flow through flow lines 70 and 72 to the injector 52 at the manifold 40. Hydrogen flows from tank 62 through a flow line 74, in which a mass flowmeter and controller 76 is connected, to the junction of flow lines 70 and 72 and through flow line 72 to the injector 52. Air flows from tank 64 through a flow line 78, in which a mass flowmeter and controller 79 are connected, to the junction of flow lines 70 and 72, and through the flow line 72 to the injector 52.

The exhaust system 28 includes a pair of gaseous filters 80 and 81 that are connected by a flow line 82 to the exhaust zone of the furnace 24. A flow line 84, in which a furnace pressure control valve 86 is included, connects the outputs of filters 80 and 81 to a vacuum pump 88. The output pressure in flow line 84 is indicated by a pressure gauge 90. A by-pass valve 92 may be connected between the outputs of filters 80 and 81, as shown. The output of vacuum pump 88 is connected to a flow line 94 to a gas scrubber 96. The output of the gas scrubber 96 is connected by a flow line 98 through which the scrubbed gases are vented to the atmosphere. The exhaust system 28 is provided to evacuate the gaseous reaction products that are released in the reaction chamber 48 during the pretreatment and silicon carbide deposition processes.

The SiC material to be deposited on a substrate 12 in the deposition chamber 48, as previously mentioned, is fabricated by reacting MTS with $H_2$. Other silane and hydrogen sources can be used, however, to form SiC. This material has been fabricated over a wide range of deposition temperature and reactor pressure, that is, pressure in the furnace reaction chamber 48, as shown in Table I below:

TABLE I

| Material Produced | Flow Rates *(Slpm) | | | Deposition Temperature C. | Reactor/ Pressure/ torr | Deposition Rate $\mu m/min$. |
|---|---|---|---|---|---|---|
| | $H_2$ | $CH_3SiCl_3$ | Ar | | | |
| SiC | $\leq 10$ | $\leq 2$ | $\leq 4$ | 1050–1350 | 25–300 | $\leq 3.5$ |

*Standard liters per minute

The reagents are introduced into the reaction chamber 48 through the injector 52 which, as shown, is centrally located. While not shown, the injector 52 may be cooled with water to prevent deposition in the injector 52, and to keep the temperature of the reagents low thereby minimizing gas phase decomposition or nucleation. The deposition thickness is controlled by varying the deposition process parameters and the deposition time. After a sufficient thickness of the SiC material has been deposited, the deposition process is terminated and the furnace is cooled down very slowly to minimize any tendency to cracking of the replicated structure due to residual stresses.

The replication of a polished silicon carbide substrate, in accordance with the invention, involves, prior to the deposition of the silicon carbide replica, the deposition at 1300° C. of a thin carbon layer or film on the polished surface of the substrate to be replicated. The carbon film deposited in such pretreatment step allows for the substrate and the replica to be easily separated after the silicon carbide deposition. Upon separation, the carbon film adheres to the surface of the replica. The as-separated surface of the replica has the high finish and figure matching the finish and figure of the substrate.

The carbon film can be deposited using several different gas mixtures: (1) MTS; (2) air; and (3) air +MTS. By using air as a reactant the polished surface of the substrate, in effect, is treated with oxygen. In a preferred embodiment of the invention which has produced the best replication results, the substrate is first treated in situ with air for five (5) minutes followed immediately by a treatment of air plus methyltrichlorosilane for three (3) minutes. The conditions required for deposition of silicon carbide were then initiated and continued for thirty (30) hours. A summary of the chemical vapor deposition conditions to achieve silicon carbide replication, in accordance with the two-step pretreatment process of the preferred embodiment of the invention, are given in Table II.

TABLE II

| Substrate Temp. (°C.) | Furnace Pressure (mm. Hg) | Gas Flow Rates (Slpm) | | | | Deposition Time |
|---|---|---|---|---|---|---|
| | | MTS | Ar | H$_2$ | Air | |
| 1300 | 200 | -0- | 5.0 | -0- | 0.1 | 5 min. |
| 1300 | 200 | 0.45 | 5.0 | -0- | 0.1 | 3 min. |
| 1300 | 200 | 0.70 | 2.0 | 3.0 | -0- | 30 hrs. |

The schematic illustration of FIG. 7 provides in greater detail an explanation of the silicon carbide replication process of the invention. As there shown, a carbon rich silicon carbide film 100 is first deposited on a polished silicon carbide substrate 102 and then a layer 104 of chemically vapor deposited SiC is grown over the film 100. At the end of the deposition, the replicated SiC 104 is easily separated from the substrate 102. This is because of the weak bond between the film 100 and the silicon carbide 104. Good replication is achieved by making the film very thin. It is believed that the thinner the film the better the replication. Irrespective of the validity of this hypothesis, excellent replication has been achieved with the thickness of the film 100 in this range.

The substrate and replica surfaces produced in experiments with the different gas mixtures were characterized using a variety of techniques. From such characterization studies, some information about the replication process was obtained. First, the air or O$_2$ +Ar pretreatment produces a thin silicon dioxide (SiO$_2$) film on the SiC substrate. Second, a carbon layer is deposited as a result of the MTS +Ar and O$_2$ +MTS +Ar treatments. The data indicates that this carbon has a high finish and is in the form of a glassy carbon or incomplete graphitized carbon. The oxygen most likely promotes the disassociation of the MTS and the formation of a shiny carbon film (as compared to the less bright carbon surface formed using MTS +Ar alone), although the chemical mechanism is not understood. For the two-step process, O$_2$ +Ar followed by O$_2$ +MTS +Ar, the thickness of the SiO$_2$ film (produced during the O$_2$ +Ar step) ranged from 0.006-0.036 μm (60-360 Å) and the carbon film (produced during the O$_2$ +MTS +Ar step) ranged from 0.22 to 1.00 μm (2200-10000 Å), respectively.

The following Examples are intended to be illustrative and not be limiting in any way.

EXAMPLE I

The chemical vapor deposition apparatus of FIG. 1 was used to pretreat in situ and to obtain a silicon carbide deposit from MTS using the process conditions according to the preferred embodiment of the invention as set forth in TABLE II. Four (4) 1.5 inch (38 mm.) diameter polished silicon carbide substrates were placed in the reaction region or zone 48 prior to pretreatment and deposition of SiC. The substrates were each mounted in an individually associated holder made of graphite. After deposition for 30 hours, followed by cool-down, each as-deposited silicon carbide replica easily separated from its associated silicon carbide substrate. Finish and figure for each of the replicas matched the finish and figure of the original polished silicon carbide substrate individual thereto.

EXAMPLE II

The chemical vapor deposition apparatus of FIG. 1 was used to pretreat in situ and to obtain a silicon carbide deposit from CH$_3$SiCl$_3$ on four 1.5 inch (38 mm.) diameter polished silicon carbide substrates mounted similarly to the substrates of Example I, with the temperature of the substrates maintained at 1300° C. during both the pretreatment and silicon carbide growth stages. In the pretreatment stage which was of fifteen (15) minutes duration, the furnace pressure was 100 mm. Hg. The flow of argon and air were at the rates of 5 and 0.1 standard liters per minute, respectively, while the flow of MTS and H$_2$ were zero. In the silicon carbide growth stage which continued for 27 hours, the furnace pressure was 200 mm. Hg and the flow of MTS, Ar and H$_2$ were 0.70, 2.0 and 3.0 standard liters per minute, respectively. The flow of air was zero. With these conditions and deposition times, after deposition for 27 hours followed by cool-down, the as-deposited silicon carbide partially adhered to the silicon carbide substrates, i.e., separation of the replicas was achieved in two only of the four substrates.

EXAMPLE III

The chemical vapor deposition apparatus of FIG. 1 was used to pretreat in situ and to obtain silicon carbide deposit from MTS on four 1.5 inch (38 mm.) polished silicon carbide substrates, mounted similarly to the substrates in Example I, with the temperature of the substrates maintained at 1300° C. during both the pretreatment and silicon carbide growth stages. In the pretreatment stage which was of five (5) minutes duration, the furnace pressure was 400 mm. Hg. The flows of Ar and air were, at the rates of 5 and 0.1 standard liters per minute, respectively, while the flow of MTS and H$_2$ were zero. In the silicon carbide growth stage, which continued for 36 hours, the furnace pressure was 200 mm. Hg and the flow of MTS, Ar and H$_2$ were 0.70, 2.0 and 3.0 standard liters per minute, respectively. After deposition for 36 hours, followed by cool-down, under these conditions, the as-deposited SiC partially adhered to the silicon carbide substrates, i.e., sections of some of the as-deposited silicon carbide replicas separated.

EXAMPLE IV

Figure 8:
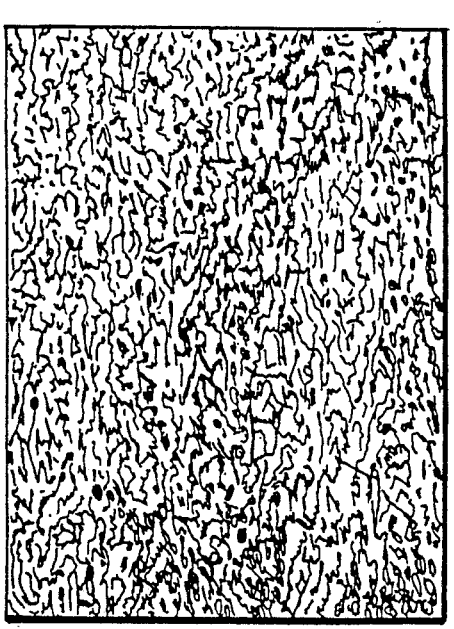
FIG. 8 is a micrograph of the polished surface of a chemically vapor deposited silicon carbide substrate before deposition.
Figures 9, 10:
FIG. 9 is a micrograph of the surface of the substrate of FIG. 8 after deposition.
FIG. 10 is a micrograph of the replicated, as deposited surface of the substrate of FIG. 8.

The chemical vapor deposition apparatus of FIG. 1 was used to pretreat in situ and to obtain a silicon carbide deposit from MTS on a 1.5 inch (38 mm.) polished silicon carbide substrate mounted similarly to the substrate of Example I with the temperature of the substrate maintained at 1300° C. during both the pretreatment and silicon carbide growth stages. In the pretreatment stage which was of five (5) minutes duration, the furnace pressure was 200 mm. Hg. The flow of Ar and air were, respectively, 5 and 0.10 standard liters per minute, with the flow of $CH_3SiCl_3$ and $H_2$ being zero. In the silicon carbide growth stage, which was of 40 hours duration, the furnace pressure was maintained at 200 mm. Hg and the flow of MTS, Ar and $H_2$ were 0.70, 2.0 and 3.0 standard liters per minute, respectively, with the flow of air being zero. After deposition and cool-down, the as-deposited silicon carbide replica was easily separated from the substrate, i.e., they simply fell apart when the furnace 24 was disassembled at the end of the run. FIGS. 8 and 10 of the drawings show micrographs, respectively, of the silicon carbide substrate surface before deposition, the substrate surface after the deposition, and the replicated, as-deposited surface of the replica. Magnification is 200×. Notice that the post-deposition substrate surface and the replicated, as-deposited surfaces are very similar and have surface features which are $\leq 5$ μm. The predeposition substrate surface (FIG. 8) appears to be smoother (having fewer features) than the post-deposition surface and replicated surface.

EXAMPLE V

The chemical vapor deposition apparatus of FIG. 1 was used to pretreat in situ and to obtain a silicon carbide deposit from MTS on a 1.5 inch (38 mm.) polished silicon carbide mounted similarly to the substrates of Example I, with the temperature of the substrate maintained at 1300° C. during both the pretreatment and silicon carbide growth stages. In the pretreatment stage which was of five (5) minutes duration, the furnace pressure was 100 mm. Hg. The flow of Ar and air were, respectively, 5 and 0.1 standard liters per minute with the flow of MTS and $H_2$ being zero. In the silicon carbide growth stage, which was of 16 hours duration, the furnace pressure was 200 mm. Hg and the flows of MTS, $H_2$ and Ar were 0.70, 2.0 and 3.0 standard liters per minute, respectively. The flow of air was zero. The as-deposited silicon carbide adhered to the silicon carbide substrates.

Summarizing the replication results, in situ oxygen etch alone appears to be sufficient to achieve replication. Analysis indicates that an oxide layer ($SiO_2$) forms on the polished silicon carbide substrate when it is exposed to oxygen at high temperature (1300° C.) and that this oxide layer acts as a catalyst to form a graphitic carbon layer upon reaction thereof with MTS during initial deposition of silicon carbide. By controlling the thickness of the oxide layer the thickness of the graphitic carbon layer and thus the degree of replication can be controlled. As mentioned hereinbefore, however, the best replication was obtained using the two-step process previously described herein: $O_2$ +Ar followed by $O_2$ +MTS +Ar.

Thus, there has been provided, in accordance with the invention, a chemical vapor deposition process for replicating the finish and figure of preshaped structures. The process of the invention has especial utility in the replication of the very high finish and figure of polished silicon carbide mirror substrates or mandrels and enables the rapid fabrication directly of mirrors of high optical quality, that is, high finish with only minor polishing of the replica being required to obtain the desired final product.

The process of the invention is characterized in the avoidance of any need for compensation for differences in the coefficients of thermal expansion between the material of the substrate or mandrel and the material being chemically vapor deposited thereon to fabricate a replica. The process is further characterized in that the original substrate or mandrel is reusable.

With this description of the invention in detail, those skilled in the art will appreciate that modifications may be made to the invention without departing from the spirit thereof. Therefore, it is not intended that the scope of the invention be limited to the specific embodiments illustrated and described.

What is claimed is:

1. A process to replicate the finish and figure of a preshaped structure comprising the steps of:
  (a) loading a preshaped substrate having a polished surface to be replicated into a chemical vapor deposition furnace, said substrate being made of a material that has a melting point higher than the deposition temperature of material being deposited thereon and which reacts with $O_2$ to form an oxide layer thereon;
  (b) evacuating, leak checking and then heating the chemical vapor deposition furnace;
  (c) pretreating the substrate in situ while heated to a temperature of about 1300° C. by introducing into the furnace, in a first step, a gaseous mixture $O_2$ +Ar to cause an oxide layer to be formed on the polished surface of the substrate, followed, in a second step, by a gaseous mixture of $O_2$ +MTS +Ar to cause a thin layer of graphitized carbon having a high finish and uniform thickness to be formed on the oxide layer on the polished surface of the substrate;
  (d) introducing a gaseous mixture of MTS +$H_2$ +Ar into the furnace to cause the deposition of a layer of SiC onto the graphitized carbon layer on the polished surface of the substrate; and
  (e) cooling the furnace to ambient temperature, removing the substrate/replica, and separating the substrate and replica.

2. A process as defined by claim 1 wherein in step (a) the preshaped substrate having a polished surface to be replicated is composed of SiC.

3. A process as defined by claim 2 wherein the conditions for the deposition of SiC are:

| substrate temperature | | 1300° C. |
|---|---|---|
| furnace pressure | | 200 torr |
| partial pressure of gases | Ar | 68 torr |
| | $H_2$ | 102 torr |
| | MTS | 30 torr |

4. A process as defined by claim 3 wherein in step (c) the deposition time in the first step is in the range of 4-5 minutes and the deposition time in the second step is in the range of $2 \geq 5$ minutes; and wherein the step (d) the deposition time is about 30 hours.

5. A process as defined by claim 4 wherein a silicon dioxide layer having a thickness in the range of 60-360 Å is produced during the first step and a carbon layer having a thickness in the range of 2200-10000 Å is produced during the second step.

6. A process as defined by claim 4 wherein the total flow of the various gases through the reaction chamber of the chemical vapor deposition furnace is maintained substantially constant during the in situ pretreatment period of step (c) and also the chemical vapor deposition silicon carbide growth period of step (d).

7. A process as defined by claim 4 wherein the total flow of gases introduced into the furnace remains substantially the same during steps (c) and (d).

8. A process as defined by claim 4 wherein $O_2$ in the mixtures of gases introduced into the furnace is in the form of special air comprising 20% $O_2$ and 80% $N_2$.

9. A process as defined by claim 4 wherein in each of the steps (c) and (d) the respective mixtures of gases are introduced into the furnace through an injector.

10. A process as defined by claim 3 wherein the general conditions under which gases are introduced into the furnace in step (c) comprise:

| First Step | | |
|---|---|---|
| substrate temperature | | 1300° C. |
| furnace pressure | | 200 torr |
| partial pressure of gases | Ar | 196 torr |
| | $O_2$ | 0.8 torr |
| deposition time | | 4–5 min. |
| Second Step | | |
| substrate temperature | | 1300° C. |
| furnace pressure | | 200 torr |
| partial pressure of gases | Ar | 177–196 torr |
| | $O_2$ | 0.8 torr |
| | MTS | 3–19 torr |
| deposition time | | 2–5 min. |

11. A process to replicate the finish and figure of a preshaped structure comprising the steps of:
    (a) loading a preshaped substrate composed of SiC having a polished surface to be replicated into a chemical vapor deposition furnace;
    (b) evacuating, leak checking and then heating the chemical vapor deposition furnace to a temperature of about 1300° C.;
    (c) pretreating the substrate in situ while at a temperature of about 1300° C. by introducing into the furnace a gaseous mixture of MTS +Ar to cause a thin layer of graphitized carbon having a high finish and uniform thickness to be formed on the polished surface of the substrate;
    (d) introducing a gaseous mixture of MTS +$H_2$ +Ar into the furnace to cause the deposition of a layer of SiC onto the graphitized carbon layer on the polished surface of the substrate; and
    (e) cooling the furnace to ambient temperature, removing the substrate/replica, and separating the substrate and replica.

12. A process as defined by claim 11 wherein $O_2$ in the mixtures of gases introduced into the furnace is in the form of special air comprising 20% $O_2$ and 80% $N_2$.

13. A process as defined by claim 11 wherein in each of the steps (c) and (d) the respective mixtures of gases are introduced into the furnace through an injector.

14. A process as defined by claim 11 wherein the general conditions under which gases are introduced into the furnace in step (c) comprise:

| substrate temperature | | 1300° C. |
|---|---|---|
| furnace pressure | | 90.0 torr |
| partial pressure of gases | Ar | 78.7 torr |
| | MTS | 11.3 torr |
| deposition time | | 10.0 min. |

15. A process to replicate the finish and figure of a preshaped structure comprising the steps of:
    (a) loading a preshaped substrate composed of SiC having a polished surface to be replicated into a chemical vapor deposition furnace;
    (b) evacuating, leak checking and then heating the chemical vapor deposition furnace to a temperature of about 1300° C.;
    (c) pretreating the substrate in situ while at a temperature of about 1300° C. by introducing into the furnace a gaseous mixture of $O_2$ +Ar to cause an oxide layer ($SiO_2$) to be formed on the polished surface of the substrate;
    (d) introducing a gaseous mixture of MTS +$H_2$ +Ar into the furnace to cause the deposition of a layer of SiC on the polished surface of the substrate with the oxide layer formed thereon in step (c) acting as a catalyst to form a graphitic carbon layer upon reaction thereon with MTS during initial deposition of SiC; and
    (e) cooling the furnace to ambient temperature, removing the substrate/replica, and separating the substrate and replica.

16. A process as defined by claim 15 wherein $O_2$ in the mixtures of gases introduced into the furnace is in the form of special air comprising 20% $O_2$ and 80% $N_2$.

17. A process as defined by claim 15 wherein in each of the steps (c) and (d) the respective mixtures of gases are introduced into the furnace through an injector.

18. A process as defined by claim 15 wherein the general conditions under which gases are introduced into the furnace in step (c) comprise:

| substrate temperature | | 1300° C. |
|---|---|---|
| furnace pressure | | 100–400 torr |
| partial pressure of gases | Ar | 98–392 torr |
| | $O_2$ | 0.4–1.6 torr |
| deposition time | | 5–15 min. |

19. A chemical vapor deposition process to replicate the finish and figure of a polished surface of a preshaped silicon carbide substrate comprising the steps of:
    (a) pretreating the substrate in situ in a chemical vapor deposition furnace that is heated to a temperature of about 1300° C., by introducing a gaseous mixture of $O_2$ +Ar into the furnace to cause the vapor deposition on the polished surface of the substrate of a thin layer of graphitized carbon film of high finish and uniform thickness;
    (b) forming a replica of the polished surface of the substrate by introducing into the heated chemical vapor deposition furnace a gaseous mixture of MTS +$H_2$ +Ar to effect the vapor deposition of a layer of silicon carbide of predetermined thickness on the layer of graphitized carbon film; and
    (c) removing the substrate/replica from the furnace and separating the substrate and replica.

20. A chemical vapor dejposition process as defined by claim 19,
    wherein, in step (a), the general conditions are:

| substrate temperature | | 1300° C. |
|---|---|---|
| furnace pressure | | 100–400 torr |
| partial pressure of gases | Ar | 98–392 torr |
| | $O_2$ | 0.4–1.6 torr |
| deposition time | | 5–15 minutes | and,
wherein, in step (b) the general conditions are:

| | | |
|---|---|---|
| substrate temperature | | 1300° C. |
| furnace pressure | | 200 torr |
| partial pressure of gases | Ar | 68 torr |
| | H$_2$ | 102 torr |
| | MTS | 30 torr |

21. A chemical vapor deposition process as defined by claim 19, wherein, in step (a), the gaseous mixture of O$_2$ +Ar is introduced, in a first step, into the furnace and is followed, in a second step, by the introduction therein of a gaseous mixture of O$_2$ +MTS +Ar and wherein the general conditions in the first step are:

| | | |
|---|---|---|
| substrate temperature | | 1300° C. |
| furnace pressure | | 200 torr |
| partial pressure of gases | Ar | 196 torr |
| | O$_2$ | 0.8 torr |
| deposition time | | 4–5 minutes | and the general conditions in the second step are:

| | | |
|---|---|---|
| substrate temperature | | 1300° C. |
| furnace pressure | | 200 torr |
| partial pressure of gases | Ar | 177–196 torr |
| | O$_2$ | 0.8 torr |
| | MTS | 3–19 torr |
| deposition time | | 2–5 minutes |

* * * * *